Figure 1:
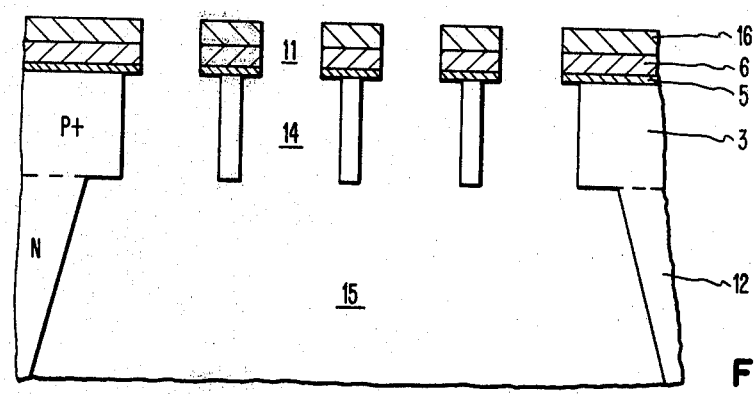

United States Patent [19]

Bohlen et al.

[11] 4,342,817

[45] Aug. 3, 1982

[54] MASK FOR STRUCTURING SURFACE AREAS, AND METHOD OF MAKING IT

[75] Inventors: Harald Bohlen, Boeblingen; Helmut Engelke, Altdorf; Johann Greschner, Pliezhausen; Peter Nehmiz, Stuttgart-Rohr, all of Fed. Rep. of Germany

[73] Assignee: International Business Machines Corporation, Armonk, N.Y.

[21] Appl. No.: 126,602

[22] Filed: Mar. 3, 1980

[30] Foreign Application Priority Data

Jun. 1, 1979 [DE] Fed. Rep. of Germany ....... 2922416

[51] Int. Cl.³ .............................................. G03C 5/00
[52] U.S. Cl. ....................................... 430/5; 156/644; 428/137; 428/596; 250/492.2; 250/505.1; 378/145
[58] Field of Search ........................... 430/5; 156/644; 428/137, 596; 250/505, 514, 492.2

[56] References Cited

U.S. PATENT DOCUMENTS

| | | | |
|---|---|---|---|
| 3,742,230 | 6/1973 | Spears | 250/505 |
| 4,021,276 | 5/1971 | Cho et al. | 156/644 |
| 4,059,480 | 11/1977 | Ruh et al. | 156/644 |
| 4,086,127 | 4/1978 | Cresswell | 156/644 |
| 4,256,532 | 3/1981 | Magdo et al. | 156/644 |

FOREIGN PATENT DOCUMENTS 1289714 10/1969 Fed. Rep. of Germany.

OTHER PUBLICATIONS

Heynick et al., "Projection Electron Lithography Using Aperture Lenses", IEEE Transactions on Electron Devices, vol. ED-22, No. 7, Jul. 1975, pp. 399–409.
Leone et al., "Fabricating Shaped Grid and Aperture Holes", IBM Technical Disclosure Bulletin, vol. 14, No. 2, Jul. 1971, p. 417.

*Primary Examiner*—Won H. Louie, Jr.
*Attorney, Agent, or Firm*—Joseph C. Redmond, Jr.

[57] ABSTRACT

A mask for structuring surface areas and a method for manufacture thereof. The mask includes at least one metal layer with throughgoing apertures which define the mask pattern and a semiconductor substrate for carrying the metal layer. The semiconductor substrate has throughholes that correspond to the mask pattern. The throughholes in the semiconductor substrate extend from the metal layer-covered surface on the front to at least one tub-shaped recess which extends from the other back surface into the semiconductor substrate. Holes are provided in a surface layer in the semiconductor substrate. The surface layer differs in its doping from the rest of the substrate and the holes which are provided in the surface layer have lateral dimensions larger than the apertures in the metal layer so that the metal layer protrudes over the surface layer.

13 Claims, 10 Drawing Figures

MASK FOR STRUCTURING SURFACE AREAS, AND METHOD OF MAKING IT

BACKGROUND OF THE INVENTION

The invention relates to a mask for use in forming elements on a structure and to a method of making a mask.

A mask of the above mentioned type can be used for ion etching, for ion implantation, and in X-ray, ion and electron beam lithography. For convenience, reference will mainly be made hereinbelow to the use of this mask in electron beam lighography only, however, the factors to be observed and the difficulties to be overcome are similarly typical for the other possible uses of this mask. This discussion with reference to electron beam lithography does not mean that the mask can not be used for other purposes.

For making structures with elements whose dimensions are in the $\mu$m range and lower by means of "photo"-lithographic methods, ultraviolet light is no longer suitable for irradiation since it does not provide the necessary resolution. In such cases, the radiation-sensitive resist is preferably irradiated with electrons. Usually so-called electron beam pattern generators are used for this purpose. In these devices, the workpiece is coated with a radiation sensitive resist. The workpiece is then directly irradiated selectively by an electron beam whose diameter is smaller than the dimension of the smallest structural element in the structure to be made. The electron beam scans the resist layer in such a manner that at the end of irradiation each point of the resist layer has been in the beam path; the electron beam being blanked out during scanning in all those positions where the resist is not to be irradiated. With these devices, very complex patterns showing very small pattern elements can be transferred with satisfactory precision. However, there is the disadvantage that they are of a very complex structure and the output obtained is so low that electron beam scanning cannot be used practically under manufacturing conditions.

The output is higher when the resist layer on the workpiece is irradiated through a mask which is spaced from the resist layer by a small distance of less than about 500 $\mu$m. The mask contains the pattern to be transferred in a ratio of 1:1. For transferring the pattern, the mask is first adjusted with respect to the workpiece, and then an electron beam whose diameter is not critical scans the mask line by line until each point of the mask has been irradiated. The mask can contain the entire pattern to be transferred, in which case the irradiated workpiece can be directed immediately to the next process step.

If the pattern to be transferred, consists of a large number of identical parts of a pattern it is possible to use a mask containing only one such part of the pattern. In this case, irradiation is effected in such a manner that upon the first alignment of the mask relative to the workpiece the part of the pattern is transferred. Subsequently, the mask is shifted relative to the workpiece by a distance corresponding at least to the width or the length of the part pattern, then the part pattern is again transferred, and these process steps are repeated until the desired number of parts of the pattern has been transferred to the radiation sensitive layer on the workpiece.

The prerequisite for transferring patterns with the necessary precision and the required high output is a mask which satisfies predetermined conditions. Where the mask is to be transparent to electrons it has to have throughholes for with every material, however thin, the electrons are scattered to such an extent that a pattern transfer with an exact edge definition in the $\mu$m or sub-$\mu$m range would be impossible if they have to pass through the material. The hole pattern in the mask has to represent the pattern to be transferred at least with the precision with which the pattern is to be transferred. Furthermore, the areas of the mask responsible for the transfer of the pattern, particularly the areas in the vicinity of the hole edges, have to be of the correct thickness. On the one hand, these areas have to be so thick that in those places where no electrons are to pass all electrons are readily absorbed. On the other hand, these areas are not to be too thick to avoid scattering effects at the pattern edges. These scattering effects prevent an exact definition of the pattern upon the transfer to the radiation sensitive layer. Finally, the mask has to be thermally stable since a high output can be reached only with a correspondingly high electron current which heats the mask.

Masks with throughholes to be used in electron beam lithography are known. L. N. Heynick, to give an example, has described a mask in the article "Projection Electron Lithography Using Aperture Lenses" published in the IEEE Transactions on Electron Devices, Vol. ED-22, No. 7. July 1975, pages 399ff. The manufacturing basis of this article is a silicon wafer carrying a thin chromium layer and a gold layer. The mask pattern is etched into the two metal layers and approximately 25 to 30 $\mu$m deep into the silicon substrate. Subsequently, the silicon wafer is thinned from the back to such an extent that the mask holes are open also in the direction of the back. Although the finished mask satisfies the condition of showing throughholes it is impossible to reproducibly make masks having the correct thickness.

In the article "Fabricating Shaped Grid and Aperture Holes" by R. A. Leone et al. published in the IBM Technical Disclosure Bulletin, Vol. 14, No. 2, July 1971, page 417, the making of a silicon wafer by a mask with throughholes is described. There, a thin N-doped epitaxial layer is first grown on an N+-doped silicon substrate. The mask pattern is generated in the epitaxial layer. Subsequently, the substrate is thinned from the wafer back, an etchant being used which selectively etches N+-doped silicon in the presence of N-doped silicon. In this manner, the thickness of the remaining silicon layer—i.e. mainly the epitaxial layer—can be controlled easily and precisely. In order to improve the heat conductivity of the mask and its electron-absorbing properties it is furthermore suggested to cover the epitaxial layer with a thin gold layer.

Another mask with throughholes and its production is described in European patent application No. 0001038. Here, too, the basis of the mask is a silicon wafer. For the thinning of the silicon wafer from the back in a defined way after the mask pattern has been etched therein, a highly boron-doped surface layer of predetermined thickness is formed on the front of a wafer substrate having P-doping. The surface layer is resistant to the etchant subsequently used for thinning.

The two last named masks have the disadvantage that, if they are to transfer pattern elements with dimensions in the lower micron range, the mask may cause scattering effects distorting the pattern.

If the thinned area having the mask pattern has a relatively wide span, its thickness must not go below a predetermined value for reasons of the necessary thermal and mechanical stability. Thus, the thickness of the thinned area must not be reduced below the value of a few μm if these mask areas are to span without any support over an area of several millimeters. However, the amount of scattering effects increases with the thickness of the edges of the holes defining the pattern.

It is the object of the invention to provide a mask for surface area structurization which permits the transfer of structural elements having their smallest dimensions in the μm range and lower with a very high precision, with a high output being possible, as well as to provide a relatively simple process for making such a mask.

These and other objects will become more apparent from the following detailed description and the accompanying claims.

The mask according to the invention is mechanically stable even under thermal stress and also in those cases where the recesses to be formed are relatively large, and where consequently the mask area has a relatively wide span. The reason for such mechanic stability is that the structure includes a differently doped layer which can be relatively thick, without impaired precision of pattern transfer due to scattering effects for the mask as disclosed by the invention. The structure can also be used in those cases where the pattern to be transferred has elements with dimensions in the submicron range. It is in this aspect that the mask as disclosed by the invention differs from known masks where an increase of mechanic stability always involves an impaired transfer quality.

The above mentioned great advantage of the mask as disclosed by the invention is due to the fact that the mask pattern is designed in a metal layer or layers and extends laterally in a defined manner over the pattern in the doped layer. In the area of the edges of the holes in the metal layer the mask is so thin that no scattering effects are encountered. On the other hand, the mask can be designed by the method disclosed by the invention in such a manner that in the area of the hole edges in the metal layer the mask can be made of such a uniform thickness that even if the mask thickness approaches the minimum value necessary for a complete absorption of the electrons, the electrons do not penetrate the mask material in any point. If gold or a similar high density material is used as a metal, the metal layer can be less than 1 μm thick when using a typical electron energy of 25 keV, without the risk of an incomplete absorption of the electrons. With the mask disclosed by the invention, pattern elements of any form can be transferred as long as they are not annular or of a closed loop shape. For transferring closed loop shaped pattern elements two masks are required. Further reference will be made thereto below.

Owing to its thermal stability, a high electron current (in the order of 50 to 100 μA) does not affect the pattern transfer quality by distortion of the mask. The thermal stability of the mask and thus the output obtainable can be advantageously increased because the doped layer is highly boron-doped. The boron atoms introduced into the silicon lattice effect a tension in the foil formed on the doped layer during thinning. The tension is released only by a temperature increase to 120° C. This tension effects on the one hand a high thermal stability of the mask as disclosed by the invention; on the other hand the high tension in the doped layer does not cause any critical distortions of the mask pattern (the whole pattern must not be distorted to more than 0.1 μm). A monocrystalline substrate favors the forming of the advantageous non-distorting tension in the foil. With the boron-doped mask according to the invention, having a span of the thin mask section or foils of 6×6 mm, such a high electron current can be applied that, in 80 msec, a 5×5 mm surface can be irradiated with sufficient intensity. With the above mentioned electron beam pattern generator an irradiation period of more than 1 sec is required for the same surface.

A high output is also possible with the mask as disclosed by the invention in those cases where the mask is of such a size that it covers only part of a substrate to be irradiated, i.e. those irradiation processes where only part of the substrate can be irradiated, and where the process steps of shifting the mask relative to the substrate, aligning the mask relative to the substrate and repeating the irradiation several times.

The process suitable for making the mask as disclosed by the invention is easily controlled. The step of underetching the metal layer is particularly controllable in that it is easily possible to produce underetchings of fractions of a μm reproducible within very small tolerances.

Another advantage of the method as disclosed by the invention is that apparatus, chemicals and some techniques used in semiconductor technology can be employed.

The invention is further described on the basis of embodiments explained by drawings, wherein FIG. 1 is a schematic cross-section of an embodiment of the mask according to the invention;

FIGS. 2A to 2I are schematic cross-sections of metal semiconductor structures in various stages of production of a mask according to the invention which is made using the method as disclosed by the invention.

Based on FIGS. 1 and 2, two embodiments of the mask as disclosed by the invention will be discussed below.

FIG. 1 represents a schematic cross-section of part of a silicon wafer which shows a surface layer 3 differing by its P+-doping from the rest of the N-doped material (substrate 1). On P+-doped layer 3, a thin chromium layer 5 and two gold layers 6 and 16 are provided. The metal layers (16, 6, 5) show apertures or windows 11 defining the mask pattern and having walls extending substantially vertically to the substrate surface. In the layer 3 therebeneath, apertures 11 expand into broader apertures 14. Apertures 14 still correspond to the mask pattern but as they are wider than apertures 11 in metal layers 5, 6 and 16 which define the mask pattern, they present an extension of the pattern over silicon layer 3.

From the surface of the silicon wafer (not shown in FIG. 1) in a plane perpendicular to the plane of the drawing, tub-shaped recesses 15 extend into the substrate to such an extent that holes 14 are opened to tub 15. A silicon wafer can have a large number of tub-shaped recesses 15 separated from each other by a rib-shaped network of N-doped substrate zones 12. Each tub-shaped recess 15 is preferably associated with a complete mask section in such a manner that all holes associated with this mask section open to this tub-shaped recess 15. Such a complete section is the mask area associated with a chip of a semiconductor wafer. For this reason the lateral dimensions of the tub-shaped recess 15 are adapted to the chip size. Chip sizes of 6×6 mm are generally accepted today. If the silicon substrate used in the mask is a monocrystalline silicon wafer with a (100)-orientation, the walls of the tub-shaped recesses 15 show an inclination of approximately 54°.

The silicon wafer has a typical thickness of approximately 400 μm. The thickness of the silicon substrate in the mask structure, however, can be lower than the thickness of the silicon wafer of the original process. This applies to the case where the mask sections associated with the individual tub-shaped recesses 15 are to be spaced at a distance smaller than the distance between the walls of two adjacent tub-shaped recesses 15 at their lowest point obtained with the above mentioned angle of 54° and a substrate thickness of 400 μm. The surface layer 3 of the P+-type, which is preferably doped with boron, has a thickness between approximately 1 and approximately 4 μm. The doping of the P+-doped layer decreases vertically from the substrate surface and with increasing distance therefrom. The thickness of the P+-layer is defined as that distance from the substrate surface where the doping has decreased to a value of $7 \times 10^{19}$ atoms/cm$^3$. The minimum width of apertures 11 is less than 1 μm. The chromium layer between the silicon substrate and the gold layers is very thin and has typically a thickness of approximately 0.02 μm. The gold layers have an overall thickness of $\leq 1$ μm.

Gold is an advantageous mask material because it has a high heat conductivity and a high density. The high heat conductivity prevents a too rapid heating of the mask if it is irradiated with an electron beam and the high density ensures that electrons relatively rich in energy are fully absorbed in a thin gold layer. A gold layer of approximately 0.8 μm thickness suffices fully to absorb electrons of an energy of 25 keV. For the absorption of electrons of higher energy, the thickness of the gold layer has to be increased but it should be kept in mind that owing to the different expansion coefficient of silicon and gold there will be an undesired and intolerable bending of the mask when the gold layers are too thick due to the inavoidable heating upon irradiation with electrons.

The existence of two gold layers is a consequence of the manufacturing process discussed below where the mask pattern is first generated with a gold layer which is too thin for fully absorbing the electrons of the generally used energy, and the mask pattern is thickened in a subsequent process step to the necessary extent by applying additional gold. The very thin chromium layer improves the adhesion of the gold layer to the silicon substrate. The object of the rib-shaped network between the tub-shaped recesses 15 of an N-doped substrate material is to give sufficient stability to the mask so that it can resist mechanical and thermal stress and so that it can also be handled under manufacturing conditions without being damaged if treated with suitable care. The rib-shaped network can ensure this stabilizing effect owing to its relatively great thickness. Although the individual rib 12 requires a relatively large amount of space, the space required for all ribs 12 is relatively small referring to the overall mask surface because in the mask, as disclosed by the invention, the surfaces of mask sections between adjacent ribs 12 can be considerably large.

The hole structure in the P+-doped layer 3 supports the mask pattern of the gold layers and gives the mask its thermal and mechanical stability within the mask sections between ribs 12. For this purpose, layer 3 has to have a minimum thickness even if it is highly boron-doped and therefore very solid. For obtaining a high output with the mask it has to be irradiated with an electron beam of the highest possible intensity. Therefore, it has to be able to carry a thermal load as the heating of the mask increases with the intensity of the beam. With a radiation current of 60 μA and an electron energy of 25 keV for instance the mask is heated to 100° C. If the radiation current is increased to 100 μA, with the other conditions remaining unchanged, the mask is heated to 200° C.

In the semiconductor field the trend is towards circuits of increasing density and to a miniaturization of circuit elements. Accordingly the pattern elements in the mask have to be made small. Today pattern elements with a width $\leq 1$ μm are no longer unusual. If holes 14 would have the same lateral dimensions as apertures 11, i.e. if the mask openings with a constant cross-section would extend through the metal layers and layer 3, and if the holes are smaller than 1 μm and the thickness of layer 3 would be between 3 and 4 μm for stability reasons, there would be scattering effects in electron beam irradiation which deteriorate the edge definition of the pattern transferred and which therefore exclude a precise transfer of the mask pattern. This problem does not appear in the masks as disclosed by the invention because the mask pattern in the metal layers (5, 6, 16) extends over the structure of silicon layer 3. This means that on the one hand the mask pattern thickness is reduced to the thickness of the metal layers so that the danger of scattering effects is eliminated, and that on the other hand the mask pattern is still supported by the structure of silicon layer 3 which independently of the width of the mask pattern apertures can now be of a thickness that is required for an optimum stabilization of the mask section under the conditions of use of the mask.

The mask pattern does not have to be provided in a gold layer or in a composite coating consisting of a thin chromium and a gold layer. Any metal can be used which has a high density and heat conductivity, and in which the mask pattern—even a pattern with very small elements—can be produced with the necessary precision. Furthermore, the metal has to adhere well to the substrate. Apart from silicon, other semiconductor materials can be used as substrates, such as gallium arsenide or germanium. These materials therefore are of particular advantage because, due to the intensive development work in the semiconductor field over a long period of time, there exists considerable expert knowledge and especially the necessary apparatus for the precise and reproducible production of very small and complex structures in these materials. Furthermore, semiconductor materials can be doped in such a way that areas such as the P+-doped layer 3 are formed which can react quite differently to an etching attack compared with those areas of the material which have not been exposed to the doping operation.

For obtaining the above mentioned favorable doping effect it is not absolutely necessary to combine a P+-doped surface layer with an otherwise N+-doped substrate. The necessary effect is obtained also in those cases where the surface layer is N-doped and the remaining substrate is N+-doped. However, as pointed out above a P+-doping is of further advantage owing to the stabilizing influence of the boron on the silicon.

As specified above, the mask can have the surface size of a conventional semiconductor wafer and be divided in mask sections by ribs 12 between the tub-shaped recesses 15. The lateral dimensions of these sections are adapted to the size of a conventional semiconductor chip. The mask can have only the size defined by one or two tub-shaped recesses 15, if the lateral dimensions are equivalent to one or two semiconductor chips.

Referring now to FIGS. 2A to 2I the method of making a mask as disclosed by the invention and as shown schematically in FIG. 1 will now be described.

An N-doped, monocrystalline silicon wafer with (100)-orientation is used as substrate 1 which typically has a thickness of approximately 400 μm but which can also be between approximately 100 and 400 μm thick. One surface of substrate 1 (in the following called the back) is coated with a 0.5 to 1 μm thick silicon dioxide layer 2. For that purpose, silicon wafer 1 is thermally oxidized for a predetermined period at a temperature of approximately 1000° C. in an oxygen/steam atmosphere. After cooling the oxide layer grown on the surface (in the following called front) facing away from the back is removed. The structure thus formed is shown sectionally by FIG. 2A in a cross-section through the silicon wafer.

Subsequently, substrate 1 is highly doped from the front with an impurity causing a P+-conductivity. It is preferable to use boron as the impurity. For doping, either ions of the impurity are implanted in a known manner, or the impurity is diffused. Whether the diffusion at high temperatures takes place in an evacuated capsule using boron-doped silicon as the diffusion source or in an open tube, the stream of carrier gas containing a boron source, preferably BBr$_3$, flows over the semiconductor wafers. During doping, P+-doped surface layer 3 is formed, whose doping is highest on the surface and whose doping decreases with the distance from the surface. The thickness of the P+ layer 3 is defined as the distance from the surface where the doping concentration is $7 \times 10^{19}$ impurity atoms/cm$^3$. The structure thus obtained is shown by FIG. 2B in a cross-section. Generally, layer 3 can also be an expitaxial layer applied on substrate 1.

Figure 2A:
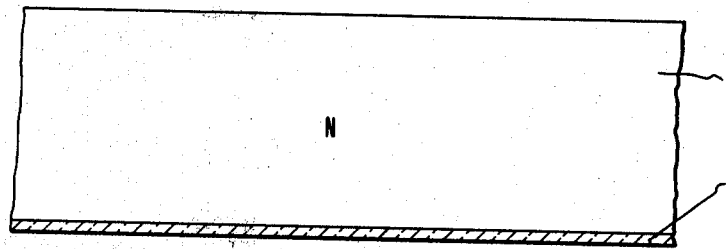
Figure 2B:
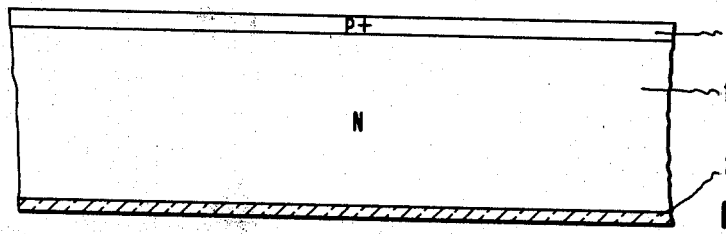
Figure 2C:
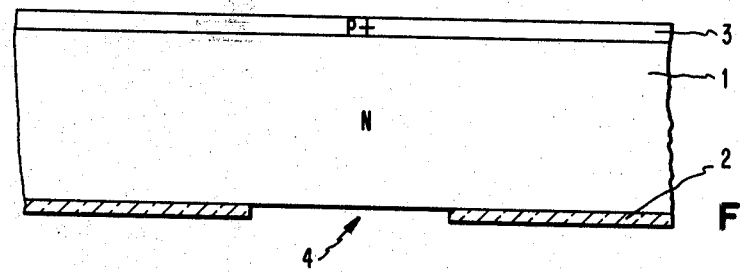

By means of a photolithographic etching process an aperture or apertures 4 is now made in oxide layer 2 on the wafer back (see FIG. 2C). The lateral dimensions of the aperture or apertures 4 are determined by the lateral dimensions of the tub-shaped recesses to be etched in a later process step.

For a better illustration of the details which are of interest in the following process steps, FIGS. 2D to 2I—differing from FIGS. 2A to 2C representing cross-sections through the entire semiconductor wafer thickness—show magnified sections of the front side surface areas of the mask structure to be made.

Figure 2D:
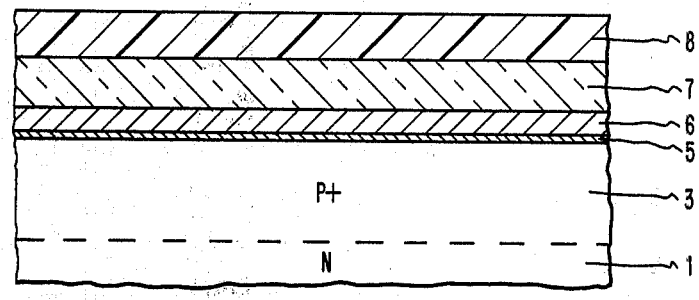

On the wafer front a thin chromium layer 5 having typically a thickness of 0.02 μm, and over that an approximately 0.3 μm thick gold layer 6 are applied by conventional vapor deposition. Onto gold layer 6, an approximately 0.8 μm thick silicon dioxide layer 7 is grown at a temperature of approximately 600° C., preferably by means of chemical vapor deposition, or through cathode sputtering. Onto silicon dioxide layer 7 an approximately 0.5 to approximately 1 μm thick layer 8 of a radiation-sensitive resist is applied by spin-on. The thus obtained structure is shown by FIG. 2D in a cross-section. Since a high resolution mask pattern is to be made the radiation-sensitive resist has to be sensitive to electron beams.

Figure 2E:
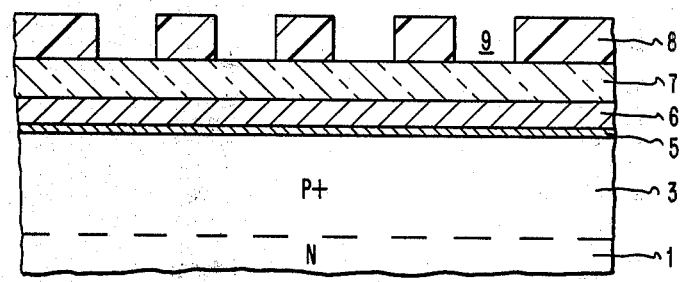
Figure 2F:
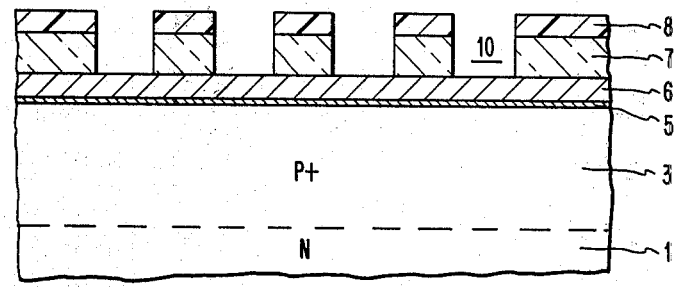
Figure 2G:
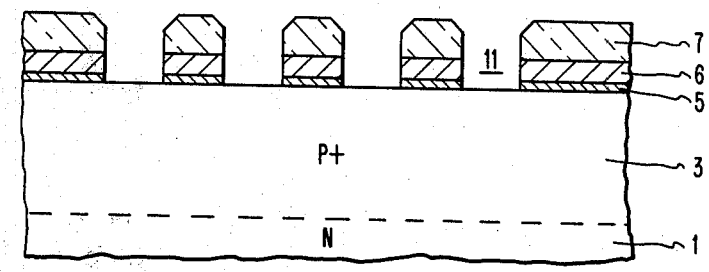

By means of an electron beam pattern generator resist layer 8 is now selectively irradiated in accordance with the respective mask pattern. There now follows the developing process, with a pattern remaining of resist layer 8 which exactly represents the desired mask pattern. With the best electron beam pattern generators commercially available today it is possible, with a resist thickness between approximately 0.5 and approximately 1 μm, to transfer lines of a width of $\leq 1$ μm into the resist with a maximum of precision. After development a structure as shown by FIG. 2E in a cross-section is obtained.

In the following process step, by means of reactive ion-etching in an atmosphere containing CHF$_3$ or a CF$_4$/H$_2$-mixture, the SiO$_2$ layer 7 is selectively etched off, i.e. in those areas where resist mask 8 shows apertures 9. For reactive ion-etching a planar cathode system is used which operates at a pressure of approximately 40 m Torr. The HF-output is at 0.2 Watt/cm$^2$ approximately, and with CF$_4$ and H$_2$ being used the flow rate ratio CF$_4$:H$_2$ is approximately 3.5:1. The pattern in the resist layer can be etched absolutely true to scale into a relatively thick SiO$_2$ layer, as the present one, and where the pattern shows a line width $\leq 1$ μm. In reactive ion-etching resist layer 8 is removed to a small extent. The openings in silicon dioxide layer 7 have vertical walls towards the substrate surface and they are in exact alignment with the openings in resist layer 8. The thus obtained structure is shown in a cross-section in FIG. 2F where the openings corresponding to the mask pattern are now marked 10. The photoresist layer 8 is then removed.

The thus exposed areas of layer 6 and the areas therebeneath of the thin chromium layer 5 are etched off with argon ions by means of ion-etching. After ion-etching the structure presents an appearance as shown in a cross-section in FIG. 2G. The openings corresponding to the mask pattern are marked 11 in FIG. 2G. Etching with argon ions is an etching process with low etching rate and small selectivity. For that reason, a gold layer of 0.3 μm only was deposited. Ion etching takes place under the following conditions:

Etching system: planar cathode system with argon plasma or high quality high vacuum system containing an (Ar)-ion beam generator source;

pressure: $10^{-3}$ Torr;

energy of argon ions approximately 1 keV.

Figure 2H:
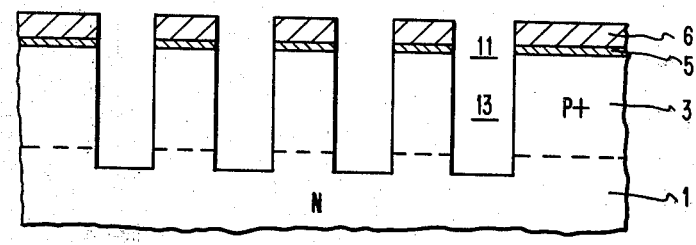
Figure 2I:
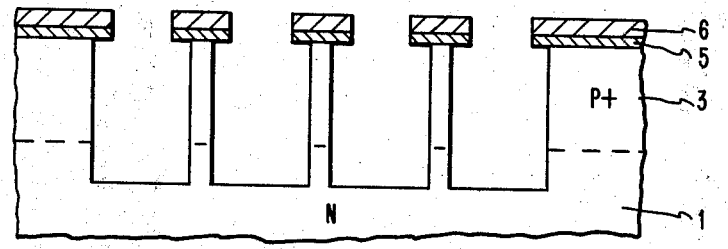

In the following process step, the P+-silicon layer is etched selectively. A reactive ion etching process is used where operation takes place in an atmosphere containing argon and chlorine. The structure in SiO$_2$ layer 7 that is approximately 0.8 μm thick is used as an etching mask. Etching conditions can be selected in such a manner that an etching speed ratio between SiO$_2$ and Si of 1:10 can be reached. If the process is applied with a planar cathode system at a pressure of approximately $1 \times 10^{-2}$ Torr in an atmosphere containing 97 volume percent of argon and 3 volume percent of chlorine, apertures with walls that are vertical to the substrate surface are etched into the P+-doped silicon layer 3. Underetching can not be detected. During etching of layer 3, layer 7 is gradually removed (remaining SiO$_2$ residues are best removed by immersion in buffered hydrofluoric acid). After layer 3 has been etched the structure shown in a cross-section in FIG. 2H is obtained. The apertures in layer 3 corresponding to the mask pattern are marked 13 in FIG. 2H. The depth of etching into the silicon is not critical; it merely has to be greater than the defined thickness of P+-doped layer 3.

In the next process step, holes 13 in P+-doped layer 3 are increased to holes 14. In this process step chromium layer 5 and gold layer 6 are underetched by a predetermined amount. For this purpose a plasma etching method can be used by means of which P+-doped silicon is etched in an atmosphere containing carbon tetrafluoride with an etching speed between approximately 20 and approximately 40 nm/min. However, this plasma etching process does not permit fully satisfactory results.

A better way of underetching is a wet etching using an etching solution consisting of ethylenediamine, pyrocatechol, water and, if necessary, hydrogen peroxide. This solution preferably consists of 72 g pyrocatechol, 630 ml ethylenediamine, 115 ml water, and 29 ml $H_2O_2$, and it is used at temperatures of about 118° C. It is known that this solution is an anisotropic etchant for monocrystalline silicon or N-doped monocrystalline silicon (100-planes are etched approximately 16 times quicker than 111-planes). It has been believed that this solution does not etch P+-doped silicon. However, investigations made in connection with the present invention have revealed that P+-doped silicon is also slightly attacked by the etching solution, i.e. this solution etches isotropically P+-doped silicon with a speed of $\leq 10$ nm/min. Consequently, this etching solution is well suited for carrying out the necessary underetching. In this underetching, the N-doped substrate material is also etched with a relatively high speed. However, this is not critical as this material would be removed anyway in the etching of tub-shaped recesses 15. Underetching supplies a structure as shown in cross-section in FIG. 2I.

For precise underetching there also exists a highly suitable dry etching process isotropically removing silicon at a very low speed. In this process etching takes place in a vacuum chamber (without a plasma) with fluorine ($F_2$). Operation starts from a solid xenon-difluoride ($XeF_2$) in a container. This container is connected via a valve to the vacuum chamber containing the substrate to be etched. At a pressure of about 10 Torr, $XeF_2$ is decomposed and the released $F_2$ flows into the vacuum chamber.

After underetching there follows the etching of the tub-shaped recesses 15 from the wafer back. Silicon dioxide layer 2 with apertures 4 serves as an etching mask. For etching, the solution of ethylenediamine, pyrocatechol, water and if necessary hydrogen peroxide (preferred composition see above) which can also be used for underetching, is used at a temperature of about 118° C. For the etching of the tub-shaped recesses the wafer front is protected by an etching cover preventing the attack of the etching solution. Owing to the above mentioned characteristics of the etching solution, the etching of tub-shaped recesses 15 is controlled very easily; actually this etching is controlled by the conditions under which the doping of layer 3 has been performed; e.g. the etching process vertical to the wafer surface is stopped completely—or according to recently acquired knowledge almost completely—if within the area of apertures 4 the substrate material 1 has been removed to such an extent that the etching solution coming from the back contacts the P+-doped layer 3 in those places where the impurity concentration of this layer is above about $7 \times 10^{19}$ atoms/cm$^3$. After the etching of the tub-shaped recesses a structure is obtained—apart from the second gold layer 16—as shown in a cross-section in FIG. 1.

In a last optional process step gold layer 6, if necessary, is increased by an additional gold layer 16 to the minimum thickness required for a full absorption of the electrons impinging with a predetermined energy. As pointed out above, the gold layers should not be thicker than necessary. Gold layer 16 is preferably applied by vapor deposition, with a vapor deposition source being as point-shaped as possible and as distanced as possible from the mask structure having to be used to prevent a lateral change of the mask structure.

Sections of the thus obtained mask structure are shown in a cross-section of FIG. 1.

The above described process can be easily modified according to experiments which are within the scope of expert knowledge if other materials, as specified above, are used for the substrate, the metal layer or metal layers where the actual mask pattern is produced, or for doping.

The mask as disclosed by the invention can be used when structures are to be made "photo"-lithographically in radiation sensitive resists. Such resist structures are used in the production of microminiaturized circuits in semiconductor wafers and in the production of magnetic bubble components such as etching masks and lift-off masks. With the masks as disclosed by the invention, patterns can be transferred in radiation sensitive resist layers which have pattern elements with widths of $\leq 1$ $\mu$m. The transfer of such patterns is also possible with the known electron beam pattern generators, but these known devices do not permit the high output required of mass production.

The masks as disclosed by the invention not only have the advantage that they can transfer patterns with maximum precision, but also the added advantage that they permit a high output. This is possible because the mask as disclosed by the invention can be irradiated with exceptionally high electron currents without there being an intolerably strong distortion. That means that high electron currents do not cause a distortion of the pattern to be transferred, but they do ensure a high output. For the complete irradiation of a round semiconductor wafer with a diameter of about 82 mm and with an electron current of 60 $\mu$A eight seconds are required.

It is assumed that the mask as disclosed by the invention fully provides the pattern to be produced. If a semiconductor wafer is to be irradiated which is composed of a great number of entirely equal chips, and if the mask as disclosed by the invention represents a pattern which corresponds to one chip size only, i.e. if after each irradiation of a chip the mask has to be shifted relative to the semiconductor wafer by one chip width, the time required for irradiating the entire wafer is increased to approximately 90 sec., with approximately 200 chips on the semiconductor wafer being assumed.

Irradiation is effected in such a manner that in an adjustment device the mask as disclosed by the invention is aligned relative to the workpiece to be processed, e.g. a semiconductor wafer that is coated with the radiation sensitive resist, and then brought with its front side to a distance from the workpiece of approximately 500 $\mu$m, and that with an electron beam with a preferred diameter of approximately 1 mm the mask is then scanned line by line until each point on the mask has been covered by the beam path.

It is obvious that with the mask as disclosed by the invention, which owing to the strong electron absorption in matter has to have throughholes, it is not possible to transfer annular or closed loop pattern elements. This problem can be solved by using two masks which contain parts of the annular pattern element which supplement each other in such a manner that if the resist layer is irradiated through both masks the annular pattern element is formed.

We claim:

1. A mask for forming patterns with improved edge definition by avoiding scattering effects at the mask pattern edges, said mask comprising:
   at least one metal layer with throughgoing apertures defining the mask pattern,
   a semiconductor substrate having front and back surfaces, the front surface carrying the metal layer and having throughholes that correspond to the mask pattern, the throughholes extending from the metal layer-covered front surface through the substrate to at least one tub-shaped recess which extends from the back surface into the semiconductor substrate,
   a surface layer provided in said semiconductor substrate, said layer differing in its doping from the rest of said substrate, and
   said throughholes, at least as far as they extend through the surface layer of said substrate, having substantially vertical sidewalls with respect to the metal layer covered surface, said sidewalls being set back relative to said apertures in said metal layer to provide said throughholes with lateral dimensions larger than said apertures in said metal layer so that said metal layer protrudes over said surface layer
   whereby a mask pattern is achieved whose effective thickness toward a scattering effect exposure is decreased to the thickness of said metal layer while still being supported by a precisely controllable semiconductor stabilization structure.

2. A mask in accordance with claim 1 wherein the metal layer is a gold layer or a composite of a chromium layer and a gold layer.

3. A mask in accordance with claim 2 wherein said metal layer comprises a plurality of gold layers.

4. A mask in accordance with claim 1, 2 or 3 characterized in that said metal layer is so thick that the electrons used for radiation are fully absorbed therein.

5. A mask in accordance with claim 2 or 3 characterized in that on the basis of an electron energy of approximately 25 keV the gold layer or gold layers are approximately 0.8 $\mu$m thick.

6. A mask in accordance with claim 1, 2 or 3 characterized in that the semiconductor substrate is silicon.

7. A mask in accordance with claim 6 characterized in that the substrate is monocrystalline silicon.

8. A mask in accordance with claim 6 characterized in that said semiconductor substrate is N- or P-doped, and said surface layer is P+-doped.

9. A mask in accordance with claim 8 characterized in that said P+-doped surface layer is doped with boron.

10. A mask in accordance with claim 1, 2 or 3 wherein said substrate is approximately 0.1 to approximately 0.4 $\mu$m thick.

11. A mask in accordance with claim 1, 2 or 3 characterized in that said metal layer protrudes or extends about 0.1 $\mu$m over said surface layer.

12. A mask in accordance with claim 1 characterized in that said substrate back forms a network of rib-shaped reinforcements of the substrate material between which there is a plurality of tub-shaped recesses whose floors form complete mask sections.

13. A mask in accordance with claim 12 wherein said tub-shaped recesses have lateral dimensions of approximately 6×6 mm.

* * * * *